US012800397B2

(12) United States Patent
Van Buggenhout

(10) Patent No.: US 12,800,397 B2
(45) Date of Patent: Nov. 17, 2026

(54) THERMAL SENSOR DEVICE AND METHOD OF MANUFACTURING THE SAME

(71) Applicant: Melexis Technologies NV, Tessenderlo (BE)

(72) Inventor: Carl Van Buggenhout, Ypres (BE)

(73) Assignee: Melexis Technologies NV, Tessenderlo (BE)

( * ) Notice: Subject to any disclaimer, the term of this patent is extended or adjusted under 35 U.S.C. 154(b) by 369 days.

(21) Appl. No.: 18/587,644

(22) Filed: Feb. 26, 2024

(65) Prior Publication Data

US 2024/0298543 A1 Sep. 5, 2024

(30) Foreign Application Priority Data

Mar. 3, 2023 (EP) .................................... 23159943

(51) Int. Cl.

| | |
|---|---|
| ***G01J 5/02*** | (2022.01) |
| ***G01J 5/04*** | (2006.01) |
| ***G01J 5/12*** | (2006.01) |
| ***H10N 10/01*** | (2023.01) |
| ***H10N 10/13*** | (2023.01) |

(Continued)

(52) U.S. Cl.

CPC ............... *G01J 5/045* (2013.01); *G01J 5/024* (2013.01); *G01J 5/12* (2013.01); *H10N 10/01* (2023.02); *H10N 10/13* (2023.02); *H10N 10/17* (2023.02); *H10W 76/48* (2026.01); *G01J 2005/123* (2013.01)

(58) Field of Classification Search

None

See application file for complete search history.

(56) References Cited

U.S. PATENT DOCUMENTS 7,364,932 B2 * 4/2008 Ikushima ............... H10N 15/00 438/48

7,563,635 B2 * 7/2009 Ikushima ............... H10N 15/00 257/E21.501

(Continued)

FOREIGN PATENT DOCUMENTS

DE 10339319 A1 * 3/2005 ......... G01N 21/3504

DE 102004020685 B3 * 9/2005 .............. G01J 5/045

OTHER PUBLICATIONS

European Search Report for Application No. EP23159943 dated Aug. 4, 2023.

*Primary Examiner* — Thomas R Artman

(74) *Attorney, Agent, or Firm* — Bracewell LLP; Keith R. Derrington

(57) ABSTRACT

A method of manufacturing a thermal sensor (106) comprises providing a first part (102) of a body of the sensor (106), the first part (102) of the body being configured to define a first part (114) of a chamber (310). A second part (104) of the body of the sensor (106) is also provided, the second part (104) of the body being configured to define a second part (118) of the chamber (310). A getter material (112) is disposed in the first part (114) of the body of the sensor (106), and the first part (102) and the second part (104) of the body of the sensor (106) are brought together so that the first and second parts (102, 104) of the chamber (310) define the chamber (310). The chamber (310) is backfilled with a gas to a pressure greater than 10 mbar, and the first part (102) of the body is bonded to the second part (104) of the body so as to seal hermetically the chamber (310).

18 Claims, 5 Drawing Sheets

(51) Int. Cl.
*H10N 10/17* (2023.01)
*H10W 76/48* (2026.01)

(56) References Cited

U.S. PATENT DOCUMENTS

| | | | | |
|---|---|---|---|---|
| 7,759,218 | B2 * | 7/2010 | Summers | B81B 7/0038<br>257/E23.137 |
| 8,866,082 | B2 * | 10/2014 | Vilain | G01J 5/02<br>250/338.1 |
| 9,511,998 | B2 * | 12/2016 | Samarao | B81C 1/00285 |
| 9,909,924 | B2 | 3/2018 | Maes et al. | |
| 9,957,154 | B2 * | 5/2018 | Favier | B81B 7/0038 |
| 10,336,610 | B2 * | 7/2019 | Stahl | B81B 7/02 |
| 10,414,647 | B2 * | 9/2019 | Favier | B81B 7/0038 |
| 10,788,370 | B2 * | 9/2020 | Herrmann | G01J 5/0225 |
| 11,289,353 | B2 * | 3/2022 | Schaller | B81C 1/00285 |
| 12,677,483 | B2 * | 7/2026 | Gleeson | H10F 19/80 |
| 2005/0176179 | A1 * | 8/2005 | Ikushima | H10N 15/10<br>438/125 |
| 2007/0056370 | A1 * | 3/2007 | Braman | G01P 1/003<br>73/514.07 |
| 2007/0262428 | A1 * | 11/2007 | Summers | B81B 7/0038<br>257/E23.137 |
| 2007/0298534 | A1 * | 12/2007 | Ikushima | H10N 15/10<br>438/57 |
| 2010/0025845 | A1 * | 2/2010 | Merz | G01C 19/5783<br>257/E23.18 |
| 2011/0141286 | A1 * | 6/2011 | Vilain | G01J 5/02<br>348/E5.09 |
| 2016/0137493 | A1 * | 5/2016 | Samarao | B81C 1/00285<br>438/59 |
| 2017/0003172 | A1 * | 1/2017 | Maes | G01J 5/0225 |
| 2017/0137281 | A1 * | 5/2017 | Favier | B81B 7/0038 |
| 2018/0111828 | A1 * | 4/2018 | Stahl | B81C 3/001 |
| 2018/0215610 | A1 * | 8/2018 | Favier | B81B 7/0038 |
| 2018/0335347 | A1 | 11/2018 | Herrmann et al. | |
| 2019/0131154 | A1 * | 5/2019 | Schaller | B81C 1/00285 |
| 2024/0295443 | A1 * | 9/2024 | Van Thienen | G01J 5/0225 |
| 2024/0297260 | A1 * | 9/2024 | Gleeson | G01J 5/045 |
| 2024/0298543 | A1 * | 9/2024 | Van Buggenhout | G01J 5/045 |
| 2024/0369415 | A1 * | 11/2024 | Chen | G01J 5/20 |
| 2025/0369808 | A1 * | 12/2025 | Van Buggenhout | G01K 7/427 |

* cited by examiner

THERMAL SENSOR DEVICE AND METHOD OF MANUFACTURING THE SAME

FIELD

The present invention relates to a thermal sensor device of the type that, for example, comprises a chamber having a predetermined atmosphere therein. The present invention also relates to a method of manufacturing a thermal sensor device, the method being of the type that, for example, comprises forming a chamber comprising a predetermined atmosphere therein.

BACKGROUND

In the field of thermal sensors, it is known to form a chamber to contain a thermal sensor element. A first wafer defines one half of the shape of a plurality of chambers, and a second wafer defines another half of the shape of the plurality of chambers. When the two wafers are brought together, the plurality of chambers is formed. One wafer typically comprises CMOS devices and Micro-electromechanical Systems (MEMS) thermal sensing elements, and the other wafer typically serves as a cap or lid.

Some thermal sensing elements in the chambers are known to operate in a vacuum and so the chambers are emptied of gasses so as to form the vacuum in the chambers. The abutted two wafers are therefore bonded together using a suitable, but relatively expensive, bonding process that ensures that the chambers are hermetically sealed.

In order to obtain stable performance of the thermal sensor devices throughout the lifetime of the devices, it is necessary for the level of vacuum in the chambers to remain substantially unchanged. However, it is desirable to employ a lower-cost bonding process, for example glass frit bonding, but the glass frit outgasses significantly and the pressures inside the cavities increase, making it very difficult to obtain a so-called "deep vacuum" (less than 1 mbar). Additionally, during the process of glass frit bonding, additional molecules from the solids encapsulating the chambers are outgassed, as well as out-diffusion of available molecules from the interior of the chambers towards solid material of the wafers defining the chambers.

In order to reduce the impact of the change in composition of the gasses in the chambers, it is known to backfill the chambers of the thermal sensor devices during bonding of the wafers. A pressure of greater than 10 mbar of a predetermined gas molecule can be achieved by way of the backfilling process, for example nitrogen or an inert gas such as Argon. By pressuring the cavities with a predetermined gas, it is possible to reduce the effect of outgassing on the responsivity of the thermal sensor devices owing to pressure changes within the chambers. However, even when the chambers are backfilled with a predetermined gas, the responsivity of the thermal sensor devices nevertheless changes over the lifetime of the thermal sensor elements as a result of outgassing and out-diffusion of molecules taking place. In this regard, the responsivity can drift by between about 0.2% and 2% over the lifetime of the thermal sensor elements, which is undesirable.

US 2019/131154 A1, DE 10 2004020685 B3 and U.S. Pat. No. 10,336,610 B2 describe sensor constructions, some of which comprise a getter and some of which employ glass frit bonding during manufacture. However, the devices disclosed in these documents do not exhibit good stability of sensitivity over the lifetime of the respective devices.

SUMMARY

According to a first aspect of the present invention, there is provided a method of manufacturing a thermal sensor, the method comprising: providing a first part of a body of the sensor, the first part of the body being configured to define a first part of a chamber; providing a second part of the body of the sensor, the second part of the body being configured to define a second part of the chamber; disposing a getter material in the first part of the body of the sensor; bringing the first part and the second part of the body of the sensor together so that the first and second parts of the chamber define the chamber; backfilling the chamber with a gas to a pressure greater than 10 mbar; and thermally bonding the first part of the body to the second part of the body so as to seal hermetically the chamber.

The method may further comprise: providing the getter material in the first part of the chamber.

The method may further comprise: providing the getter material in the first part of the chamber so as to serve as a window.

The window may be transmissive to infra-red electromagnetic radiation.

The chamber may be disposed within the body of the sensor.

The chamber may comprise a thermal sensing structure therein.

The thermal sensing structure may be a thermopile sensor.

Thermally bonding the first part of the body to the second part of the body may comprise: glass frit bonding the first part of the body to the second part of the body.

The thermal bonding of the first part of the body to the second part of the body may be performed at a predetermined temperature; the predetermined temperature may also be an activation temperature of the getter material.

The sensor may be heated to an activation temperature of the getter material after the thermal bonding of the first part of the body to the second part of the body.

The getter material may be a layer of getter material.

The method may further comprise: providing a first wafer comprising a plurality of first part formations respectively defining a plurality of first parts of chambers, the plurality of first part formations defining the first part of the chamber; providing a second wafer comprising a plurality of second part formations respectively defining a plurality of second parts of the chambers, the second plurality of second part formations defining the second part of the chamber; bringing the first and second wafers together so that the plurality of first part formations and the plurality of second part formations together respectively define a plurality of chambers including the chamber; backfilling the plurality of chambers with the gas to the pressure greater than 10 mbar; and thermally bonding the first and second wafers together so as to seal hermetically and individually the plurality of chambers.

The plurality of first part formations may be arranged as a matrix of first part formations; and the plurality of second part formations may be arranged as a matrix of second part formations.

The gas may be an inert gas. The gas may be nitrogen gas.

The getter material may be configured to sorb more hydrogen gas than the gas used to pressurise the chamber.

The getter material may be a titanium getter.

According to a second aspect of the present invention, there is provided a thermal sensor device comprising: a first part of a sensor body configured to define a first part of a chamber; and a second part of the sensor body configured to define a second part of the chamber; wherein the first part of the sensor body comprises a getter material disposed therein; the first part of the sensor body abuts and is thermally bonded to the second part of the sensor body so as to define the chamber and hermetically seal the chamber; and the chamber comprises a gas therein having a pressure greater than 10 mbar.

It is thus possible to provide a thermal sensor device, and a method of manufacture therefor that results in a thermal sensor device, that has improved immunity to drift in responsivity over the lifetime of the thermal sensor device. The method of manufacture employs, for example glass frit bonding, thereby reducing the cost of manufacture of the thermal sensor device, whilst improving stability.

At least one embodiment of the invention will now be described, by way of example only, with reference to the accompanying drawings, in which:

DETAILED DESCRIPTION OF THE EXAMPLE EMBODIMENTS

Figure 1:
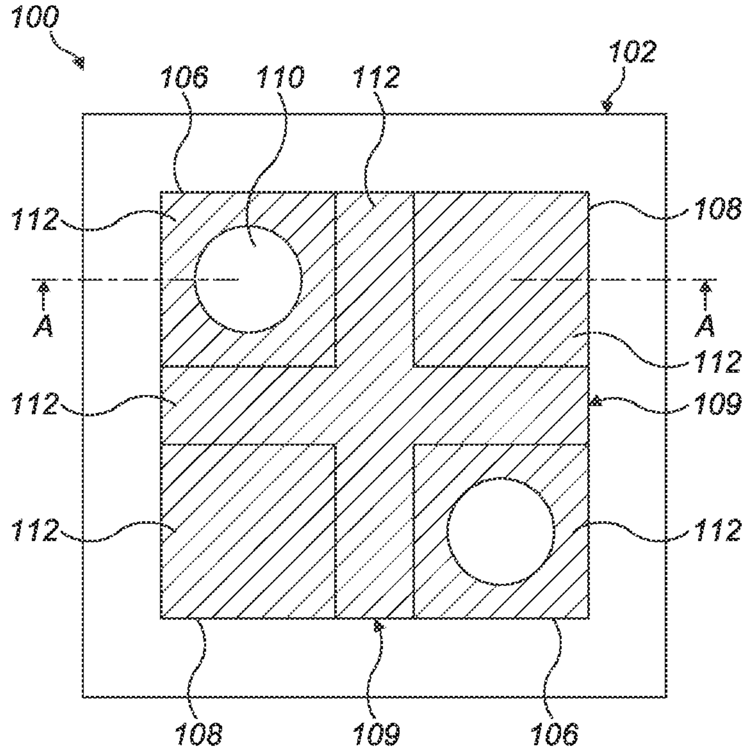
FIG. 1 is a schematic underside view of a cap portion of a thermal sensor device constituting an embodiment of the invention.

Throughout the following description, identical reference numerals will be used to identify like parts.

Referring to FIG. 1, a thermal sensor device 100, for example an infrared thermal sensor, such as a thermopile sensor, comprises a cap portion 102 (FIG. 1) and a substrate portion (described later in relation to FIG. 2). In this example, the cap portion 102 of the thermal sensor device 100 defines an “exposed” thermal sensor element 106 and a “blind” thermal sensor element 108, which are employed as a pair for measuring received infrared radiation. The thermal sensor elements are, for example, formed as clusters of four sensor elements as shown in FIG. 1, but other formations are possible. The exposed thermal sensor element 106 comprises a window 110 through which electromagnetic radiation, for example infrared electromagnetic radiation, can reach the substrate portion 104 when assembled. The exposed and blind thermal sensor elements 106, 108 as well as bridging spaces 109 between the exposed and blind thermal sensor elements are lined with a layer of a getter material 112, for example titanium. Of course, the skilled person will appreciate that other suitable materials can be employed to getter molecules from the exposed and blind thermal sensor elements 106, 108, particularly but not exclusively to getter hydrogen molecules. Example materials include: Calcium, Strontium, Barium, Zirconium, Thorium, or getter alloys like such as Zirconium-Aluminium, Zirconium-Iron, Zirconium-Nickel, Zirconium-Vanadium-Iron, Manganese-Rhenium, Yttrium-Vanadium, Yttrium-Manganese-Aluminium, or Rare-earth alloys such as Zirconium-Vanadium-Iron-Manganese-RE, Zirconium-Cobolt-RE.

Figure 2:
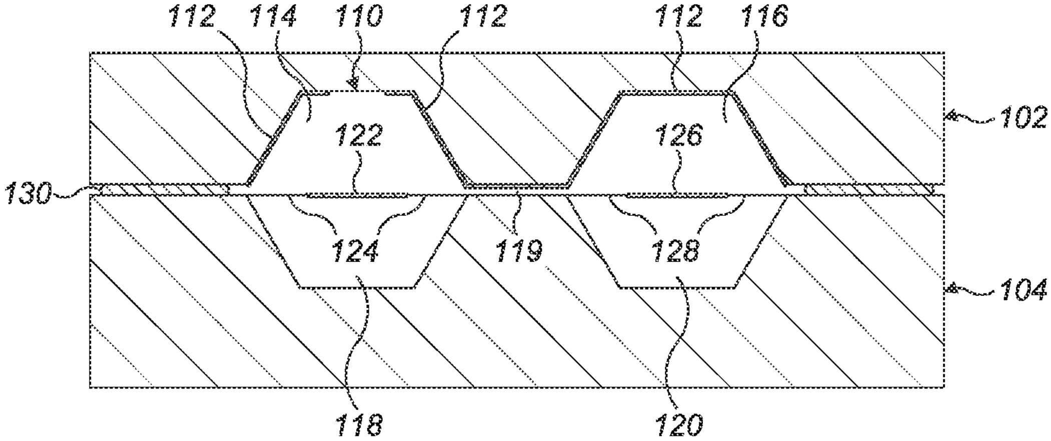
FIG. 2 is a schematic diagram of a cross section of the cap portion along the line A-A of FIG. 1 and a substrate portion of like cross section to the cap portion.
Figure 3:
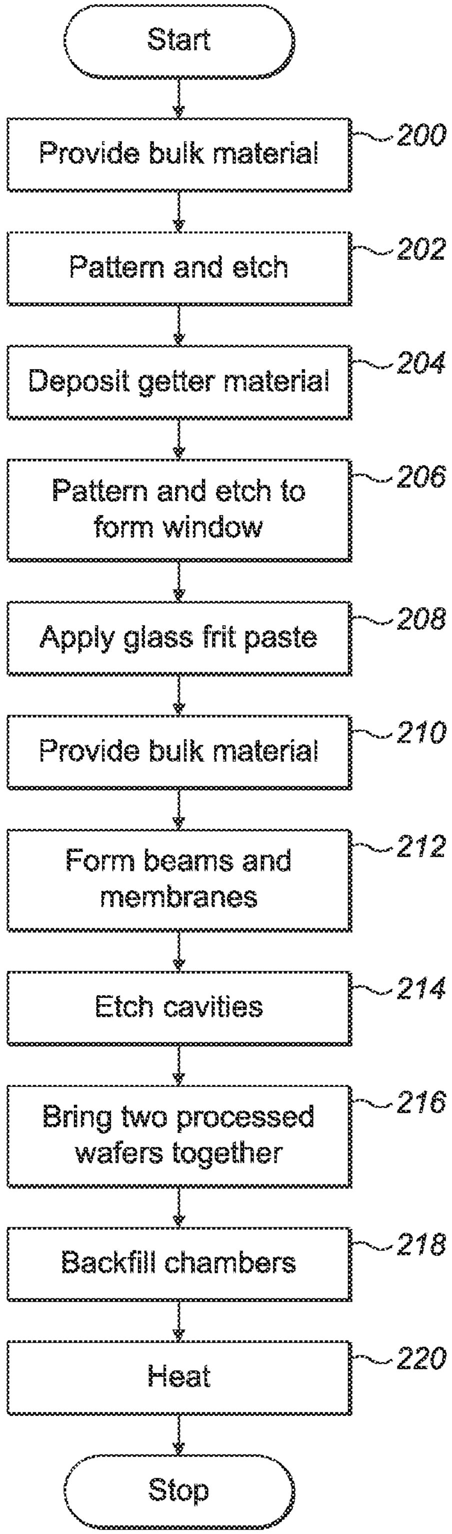
FIG. 3 is a flow diagram of a method of manufacturing the thermal sensor device of FIGS. 1 and 2 constituting another embodiment of the invention.
Figure 4:
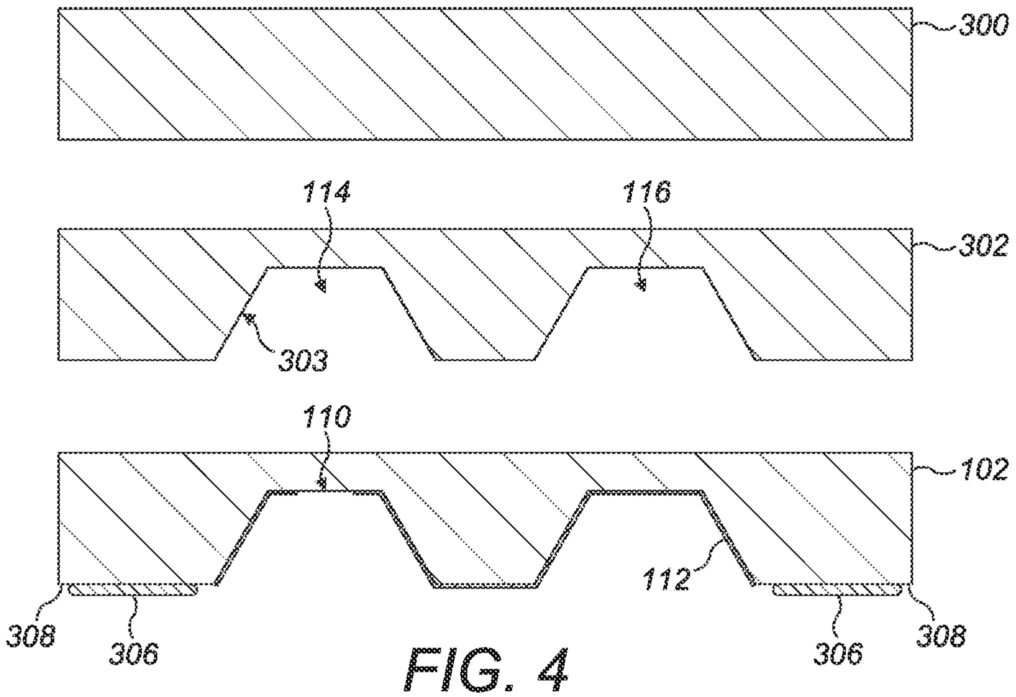
FIG. 4 is a schematic diagram of stages of manufacture of the cap portion of the thermal sensor device of FIGS. 1 and 2.
Figure 5:
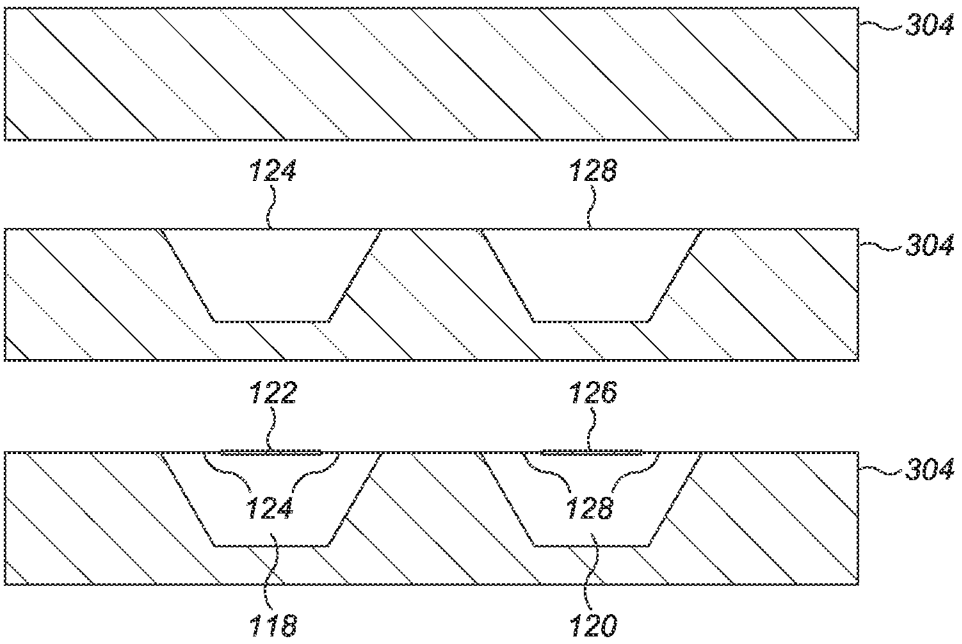
FIG. 5 is a schematic diagram of stages of manufacture of the substrate portion of the thermal sensor device of FIGS. 1 and 2.
Figure 6:
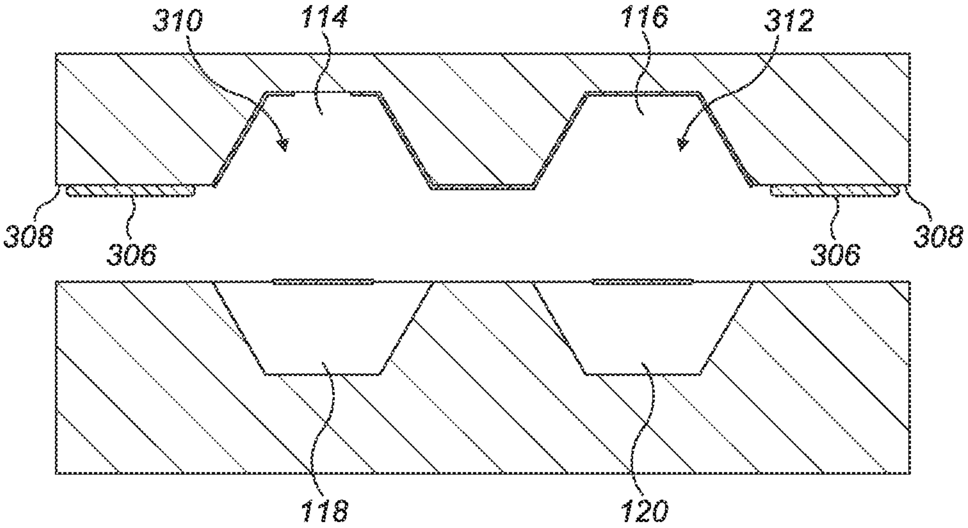
FIG. 6 is a schematic diagram of the cap portion and the substrate portion being brought together prior to bonding.

Turning to FIG. 2, the cap portion 102 constitutes a first part of a body of the thermal sensor device 100 and comprises a first recess 114 and a second recess 116 in respect of the exposed thermal sensor element 106 and the blind thermal sensor element 108, respectively. The first recess 114 defines a first part of a first chamber and the second recess 116 defines a first part of a second chamber, both of which will be described later herein. The substrate portion 104 constitutes a second part of the body of the thermal sensor device 100 and comprises a third recess 118 and a fourth recess 120, respectively corresponding to the exposed thermal sensor element 106 and the blind thermal sensor element 108. The third recess 118 defines a second part of the first chamber and the fourth recess 120 defines a second part of the second chamber. The cap portion 102 and the substrate portion 104 are sandwiched together so that the first and third recesses 114, 118 and the second and fourth recesses 116, 120 are respectively in registry. Between the exposed and blind thermal sensor elements 106, 108, the cap portion 102 is profiled so as to define passageways 119, one of which is shown in FIG. 2 between the first and second chambers of the thermal sensor device 102. However, the cap portion 102 is also profiled to define a passageway 119 (not shown) between the exposed and blind thermal sensor elements 106, 108 shown in FIG. 2 and the other two exposed and blind thermal sensor elements of the cluster of thermal sensor elements of the thermal sensor device 102 shown in FIG. 1. In this regard, the thermal sensor elements of the cluster of FIG. 1 are all in fluid communication with each other by virtue of the passageways 119. The substrate portion 104 comprises a first thermal sensing structure, for example a first thermopile sensor structure, formed from a first thermally conductive membrane 122 suspended over the third recess 118 by a first set of two or more beams 124. The substrate portion 104 also comprises a second thermal sensing structure, for example a second thermopile sensor structure, formed from a second thermally conductive membrane 126 suspended over the fourth recess 120 by a second set of two or more beams 128. The cap portion 102 and the substrate portion 104 are held together by a surrounding layer of glass 130 that has been melted between opposing faces of the cap portion 102 and the substrate portion 104 using a glass frit bonding technique.

Manufacture of the thermal sensor device 100 will now be described with reference to FIGS. 3 to 6.

The cap portion 102 is formed by providing (Step 200) a layer of light-transmissive bulk material 300, for example silicon. The layer of bulk material 300 is then patterned and etched (Step 202) using any suitable lithographic technique in order to form the first recess 114 and the second recess 116, the first and second recesses tapering inwardly with depth of etching, thereby yielding an etched layer of bulk material 302. Following removal of photoresist, the layer of getter material 112 is then deposited (Step 204) over an inner surface 303 of the etched layer of bulk material 302. The layer of getter material 112 is then patterned (Step 206) to define the window 110 in the layer of getter material 112, substantially centrally at the deepest part of the first recess 114, and then etched using any suitable lithographic technique to form the window 110 and complete the cap portion 102. Although the layer of bulk material 300 is light transmissive other materials that are less light transmissive can be employed and the window 110 can be formed in the layer of bulk material, for example by etching.

Thereafter, glass frit paste 306 is deposited (Step 208) on one of the opposing surfaces 308 of the cap portion 102 peripheral to the first and second recesses 114, 116. In this example, the glass-frit paste 306 is deposited by a printing process on the cap portion 102, because the glass-frit paste 306 has to be "fired" after printing. However, other suitable known deposition techniques can be employed.

The substrate portion 104 is then formed, although it is conceivable that the substrate portion can be formed in parallel with the cap portion 102 or prior to formation of the cap portion 102. To form the substrate portion 104, a layer of bulk substrate material 304, for example silicon, is provided (Step 210). A silicon oxide layer (not shown) is grown on the layer of bulk substrate material 304. The first and second beams 124, 128, which are also known as webs, and relatively thin, shaped, structures constituting the first and second membranes 122, 126 (sometimes called "diaphragms") are then formed (Step 212), using any suitable MEMS processing technique, for example by etching away at defined areas of the silicon oxide layer until the silicon of the layer of bulk substrate material 304 is reached. The first set of beams 124 and the first membrane 122 are configured so as to form a first thermopile, and the second set of beams 128 and the second membrane 126 are configured so as to form a second thermopile. Proximal ends of the first and second sets of beams 124, 128 are coupled to the first and second membranes 122, 126. Distal ends of the first and second sets of beams 124, 128 are coupled to the bulk layer of substrate material 304. The distal ends of the first and second sets of beams 124, 128 are connected to electrically conductive pathways (not shown), for example vias, formed within the bulk layer of substrate 304. As the formation of the first and second sets of beams, 124, 128, the first and second membranes 122, 126 or the vias, are not central to an understanding of the embodiments set forth herein, for the sake of clarity and conciseness of description details of these parts of the exposed and blind thermal sensor elements 106, 108 will not be described further herein. Portions of the bulk layer of substrate material 304 beneath the first and second beams 124, 128 and the first and second membranes 122, 126 are then etched (Step 214) so as to form the third and fourth recesses 118, 120, over which the first and second beams 124, 128 and the first and second membranes 122, 126 are suspended, using any suitable known etching technique.

Once the cap portion 102 and the substrate portion 104 have been formed, the cap portion 102 and the substrate portion 104 are then brought together (Step 216) in an aligned manner to define the first chamber 310 of the exposed thermal sensor element 106 and the second chamber 312 of the blind thermal sensor element 108, the first and second chambers 310, 312 being within the body of the thermal sensor device 100.

The first and second chambers 310, 312 are then backfilled (Step 218) with a suitable gas, for example Nitrogen, or an inert gas, for example Argon. The first and second chambers 310, 312 are backfilled to a pressure greater than 10 mbar, for example greater than 12 mbar or greater than 15 mbar or greater than 30 mbar, or for example greater than 100 mbar, or for example greater than 300 mbar, or for example greater than 700 mbar.

The sandwich of the cap portion 102, the glass frit paste 306 and the substrate portion 104 are then heated (Step 220) to a temperature above about 410° C. in accordance with any suitable glass frit bonding technique to a predetermined temperature in order to bond the cap portion 102 to the substrate portion 104, therefore completing formation of the exposed thermal sensor element 106 and the blind thermal sensor element 108, the cap portion 102 and the substrate portion 104 being bonded to each other so as to form a hermetic seal around the periphery of the cap and substrate portions 102, 104. In this example, the predetermined temperature is also an activation temperature of the getter material 112. As mentioned above, the heating temperature employed is above about 410° C., and can be about 420° C. or above, about 430° C. or above, about 435° C. or above, or about 440° C.

During heating, the layer of getter material 112 activates in order to sorb molecules released from the structure of the thermal sensor device 100 during the heating process when bonding the cap portion 102 to the substrate portion 104. These molecules include hydrogen molecules, and the getter material 112, in this example, sorbs more hydrogen than the backfilling gas. Hydrogen has a larger influence on thermal conductivity within the first and second chambers 310, 312, as compared to other gasses, for example nitrogen. Preferentially, the getter sorbs all the hydrogen that is being outgassed during the wafer bonding process, but if the surface area or the volume of the getter material 112 is insufficient to getter all the hydrogen outgassed during the wafer bonding process mentioned above when the cap portion 102 is bonded to the substrate portion 104, sufficient hydrogen gas is nevertheless gettered so that the residual hydrogen gas pressure within the first and second chambers 310, 312 is too small as a proportion of the pressure of the backfill gas to influence the thermal conductivity in the first and second chambers 310, 312 significantly. As such the sensitivity drift of the thermal sensor device 100 is improved. In this example, the activation of the getter material 112 takes place at the same time as the glass frit bonding. However, in other examples, the activation of the getter material 112 can take place subsequent to the glass frit bonding using a subsequent heating process.

Figure 7:
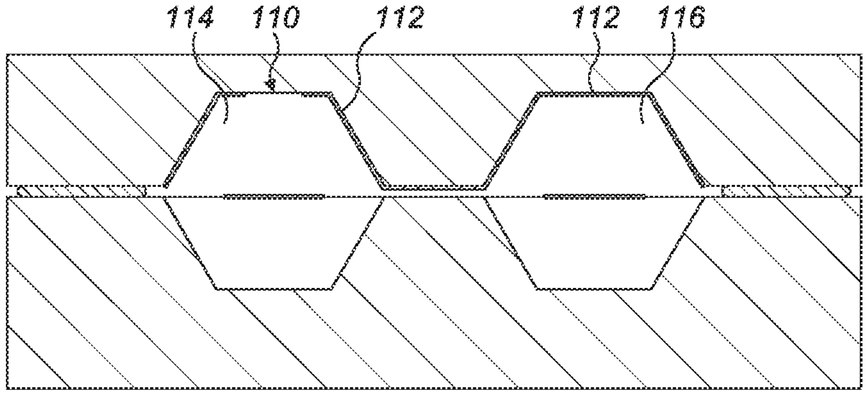
FIG. 7 is a schematic diagram of a cross section of the cap portion and the substrate portion of another thermal sensor device and constituting yet another embodiment of the invention.
Figure 8:
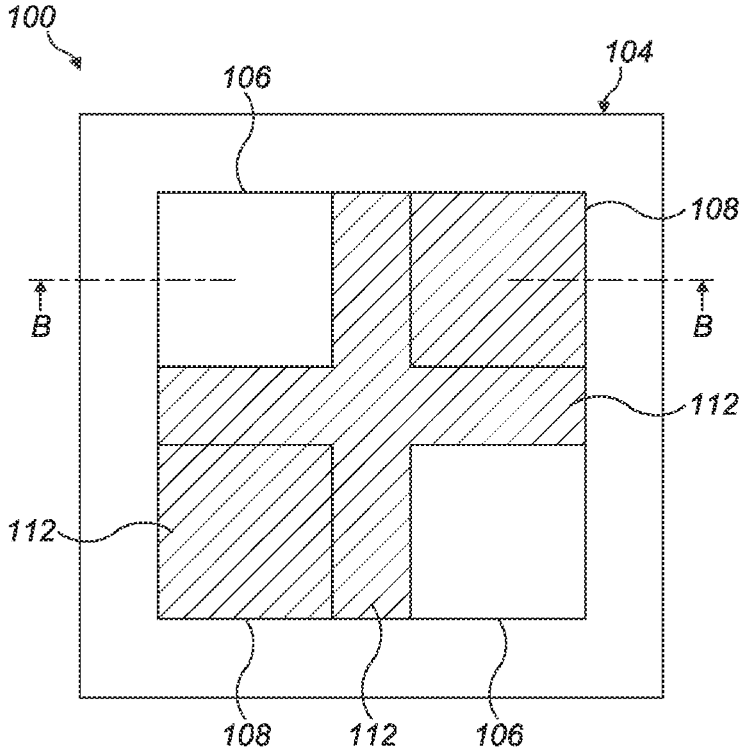
FIG. 8 is a schematic underside view of another cap portion of yet another thermal sensor device constituting a further embodiment of the invention.
Figure 9:
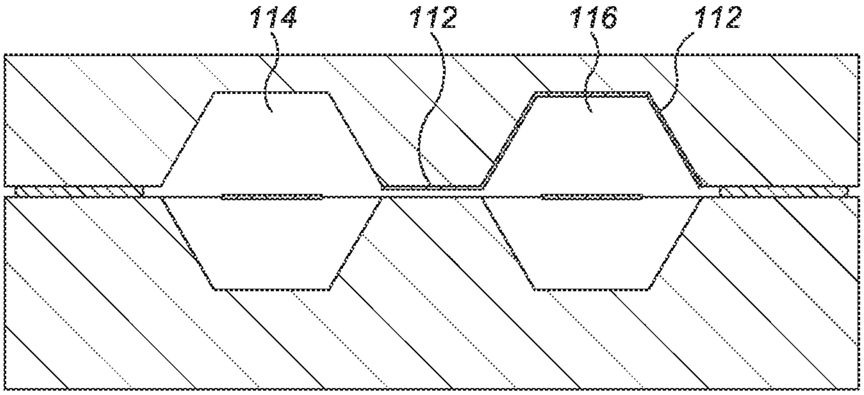
FIG. 9 is a schematic diagram of a cross section of the cap portion of FIG. 8 along the line B-B and a substrate portion of like cross section to the cap portion formed for attachment to the cap portion.

Although the getter material 112 in the above example is deposited over the internal surfaces of the first and second recesses 114, 116, the bridging spaces 109 defining upper surfaces of the passageways 119, of the cap layer 102 and the window 110 is provided in the getter material 112 in the first recess 114 of the exposed thermal sensor element 106, in another embodiment (FIG. 7), the getter material 112 is disposed only in the first and second recesses 114, 116 and not on any opposing surfaces of the cap portion 102 and the substrate portion 104, for example the surface of the bridging spaces 109 of the cap portion 102 defining the upper surfaces of the passageways 119. Referring to FIGS. 8 and 9, in a further example, instead of the window 110 being formed in the getter material 112 deposited in the first recess 114, the getter material 112 is completely removed from the first recess 114 during the getter structuring process to leave the getter material 112 deposited in the second recesses corresponding to the blind thermal sensor elements and the surface of the bridging spaces 109 of the cap portion 102 defining the upper surfaces of the passageways 119.

In the above examples, the getter material 112 is deposited on the cap portion 102. However, in other embodiments, the getter material 112 can be deposited on the substrate portion 104 or on both the cap portion 102 and the substrate 104.

It should also be understood that although glass frit bonding is described throughout to bond the cap portion 102 to the substrate portion 104, any other suitable thermal bonding technique can be employed.

The use of thermopile sensor structures is described herein. However, the skilled person will appreciate that the embodiment set forth herein can be employed in relation to other thermal sensor structures, for example bolometers.

Whilst the thermal sensor device 100 comprises, in the above examples, the exposed thermal sensor element 106 and the blind thermal sensor element 108 pairing, the skilled person should appreciate that in other embodiments, such pairings need not be employed and it is conceivable that exposed thermal sensor elements are employed without corresponding blind thermal sensor elements.

The above examples have been described in respect of a single thermal sensor device 100. However, a thermal sensor array, for example a matrix arrangement, comprising a plurality of thermal sensor devices described herein can be formed, a first wafer comprising a plurality of cap portions and a second wafer comprising a plurality of substrate portions, which when brought together form a plurality of thermal sensor devices.

What is claimed is:

1. A method of manufacturing a thermal sensor, the method comprising:
- providing a first part of a body of the sensor, the first part of the body being configured to define a first part of a chamber;
- providing a second part of the body of the sensor, the second part of the body being configured to define a second part of the chamber;
- disposing a getter material in the first part of the body of the sensor;
- bringing the first part and the second part of the body of the sensor together so that the first and second parts of the chamber define the chamber;
- backfilling the chamber with a gas to a pressure greater than 10 mbar; and
- thermally bonding the first part of the body to the second part of the body so as to seal hermetically the chamber.

2. The method according to claim 1, further comprising:
- providing the getter material in the first part of the chamber.

3. The method according to claim 1, further comprising:
- providing the getter material in the first part of the chamber so as to serve as a window.

4. The method according to claim 3, wherein the window is transmissive to infra-red electromagnetic radiation.

5. The method according to claim 1, wherein the chamber is disposed within the body of the sensor.

6. The method according to claim 1, wherein the chamber comprises a thermal sensing structure therein.

7. The method according to claim 6, wherein the thermal sensing structure is a thermopile sensor.

8. The method according to claim 1, wherein thermally bonding the first part of the body to the second part of the body comprises:
- glass frit bonding the first part of the body to the second part of the body.

9. The method according to claim 1, wherein the thermal bonding of the first part of the body to the second part of the body is performed at a predetermined temperature, the predetermined temperature is also an activation temperature of the getter material.

10. The method according to claim 1, wherein the sensor is heated to an activation temperature of the getter material after the thermal bonding of the first part of the body to the second part of the body.

11. The method according to claim 1, wherein the getter material is a layer of getter material.

12. The method according to claim 1, further comprising:
- providing a first wafer comprising a plurality of first part formations respectively defining a plurality of first parts of chambers, the plurality of first part formations defining the first part of the chamber;
- providing a second wafer comprising a plurality of second part formations respectively defining a plurality of second parts of the chambers, the second plurality of second part formations defining the second part of the chamber;
- bringing the first and second wafers together so that the plurality of first part formations and the plurality of second part formations together respectively define a plurality of chambers including the chamber;
- backfilling the plurality of chambers with the gas to the pressure greater than 10 mbar; and
- thermally bonding the first and second wafers together so as to seal hermetically and individually the plurality of chambers.

13. The method according to claim 12, wherein the plurality of first part formations is arranged as a matrix of first part formations, and the plurality of second part formations is arranged as a matrix of second part formations.

14. The method according to claim 1, wherein the gas is an inert gas.

15. The method according to claim 1, wherein the gas is nitrogen gas.

16. The method according to claim 1, wherein the getter material is configured to sorb hydrogen gas and the getter material is also configured to sorb more hydrogen gas than the gas used to pressurise the chamber.

17. The method according to claim 1, wherein the getter material is a titanium getter.

18. A thermal sensor device comprising:
- a first part of a sensor body configured to define a first part of a chamber; and
- a second part of the sensor body configured to define a second part of the chamber; wherein
- the first part of the sensor body comprises a getter material disposed therein;
- the first part of the sensor body abuts and is thermally bonded to the second part of the sensor body so as to define the chamber and hermetically seal the chamber; and
- the chamber comprises a gas therein having a pressure greater than 10 mbar.

* * * * *